United States Patent
Maxik et al.

(10) Patent No.: US 8,955,357 B2
(45) Date of Patent: Feb. 17, 2015

(54) SYSTEM AND METHODS OF EMBEDDING MATERIAL IN A GLASS SUBSTRATE

(71) Applicant: Lighting Science Group Corporation, Satellite Beach, FL (US)

(72) Inventors: Fredric S. Maxik, Indialantic, FL (US); David E. Bartine, Cocoa, FL (US); Theodore Scone, Satellite Beach, FL (US); Sepehr Sadeh, Melbourne, FL (US)

(73) Assignee: Lighting Science Group Corporation, Melbourne, FL (US)

( * ) Notice: Subject to any disclaimer, the term of this patent is extended or adjusted under 35 U.S.C. 154(b) by 0 days.

(21) Appl. No.: 14/208,863

(22) Filed: Mar. 13, 2014

(65) Prior Publication Data

US 2014/0315376 A1 Oct. 23, 2014

Related U.S. Application Data

(60) Provisional application No. 61/792,737, filed on Mar. 15, 2013.

(51) Int. Cl.
| | | |
|---|---|---|
| *C03B 19/10* | (2006.01) | |
| *C03C 15/00* | (2006.01) | |
| *H01L 21/336* | (2006.01) | |
| *H01L 21/265* | (2006.01) | |
| *H01L 21/225* | (2006.01) | |

(52) U.S. Cl.
CPC .................................. *H01L 21/225* (2013.01)
USPC ........... 65/17.1; 65/30.13; 438/268; 438/519; 438/522; 257/E23.095; 257/E31.046; 257/E21.065

(58) Field of Classification Search
USPC ......... 438/142, 105, 613, 519, 522, 965, 268, 438/931, 479, 478, 487, 535, 46, 93, 796, 438/542, 45, 276, 350, 358, 369, 376, 418, 438/433, 447, 449, 514; 257/432, E23.095, 257/E31.046, E33.068, E33.073, E21.065
See application file for complete search history.

(56) References Cited

U.S. PATENT DOCUMENTS

| | | | | |
|---|---|---|---|---|
| 5,336,641 A | * | 8/1994 | Fair et al. | 438/486 |
| 5,399,231 A | * | 3/1995 | McCarthy | 438/406 |
| 5,578,513 A | * | 11/1996 | Maegawa | 438/151 |
| 5,595,944 A | * | 1/1997 | Zhang et al. | 438/158 |
| 6,660,085 B2 | * | 12/2003 | Hara et al. | 117/219 |
| 6,939,748 B1 | * | 9/2005 | Quick | 438/142 |
| 7,183,127 B2 | * | 2/2007 | Kuriyama et al. | 438/34 |
| 7,262,431 B2 | * | 8/2007 | Hara et al. | 257/64 |
| 7,419,887 B1 | * | 9/2008 | Quick et al. | 438/479 |
| 7,432,141 B2 | * | 10/2008 | Gu et al. | 438/166 |

(Continued)

*Primary Examiner* — Evan Pert
*Assistant Examiner* — Gustavo Ramallo
(74) *Attorney, Agent, or Firm* — Mark R. Malek; Daniel C. Pierron; Widerman Malek, PL

(57) ABSTRACT

A method for embedding a dopant into a glass substrate is provided. The method may include the steps of applying the dopant to a surface of the glass substrate, positioning the glass substrate adjacent to a catalyst such that the dopant is intermediate the catalyst and the glass substrate, heating the glass substrate to a first temperature, operating a directed thermal energy source so as to generate thermal energy incident upon the dopant, reducing the temperature of the glass substrate to a second temperature below the first temperature, and holding the glass substrate at the second temperature for at least a period of time.

21 Claims, 6 Drawing Sheets

(56) References Cited

U.S. PATENT DOCUMENTS

| | | |
|---|---|---|
| 7,629,629 B2 * | 12/2009 | Saitoh et al. .................. 257/213 |
| 7,630,147 B1 * | 12/2009 | Kar et al. ...................... 359/716 |
| 7,838,887 B2 * | 11/2010 | Woon et al. .................... 257/74 |
| 7,939,129 B2 * | 5/2011 | Varanasi et al. ............... 427/165 |
| 7,951,632 B1 * | 5/2011 | Quick et al. .................... 438/46 |
| 8,253,153 B2 * | 8/2012 | Shanks ........................... 257/98 |
| 2005/0253137 A1 * | 11/2005 | Whang et al. ................... 257/40 |

* cited by examiner

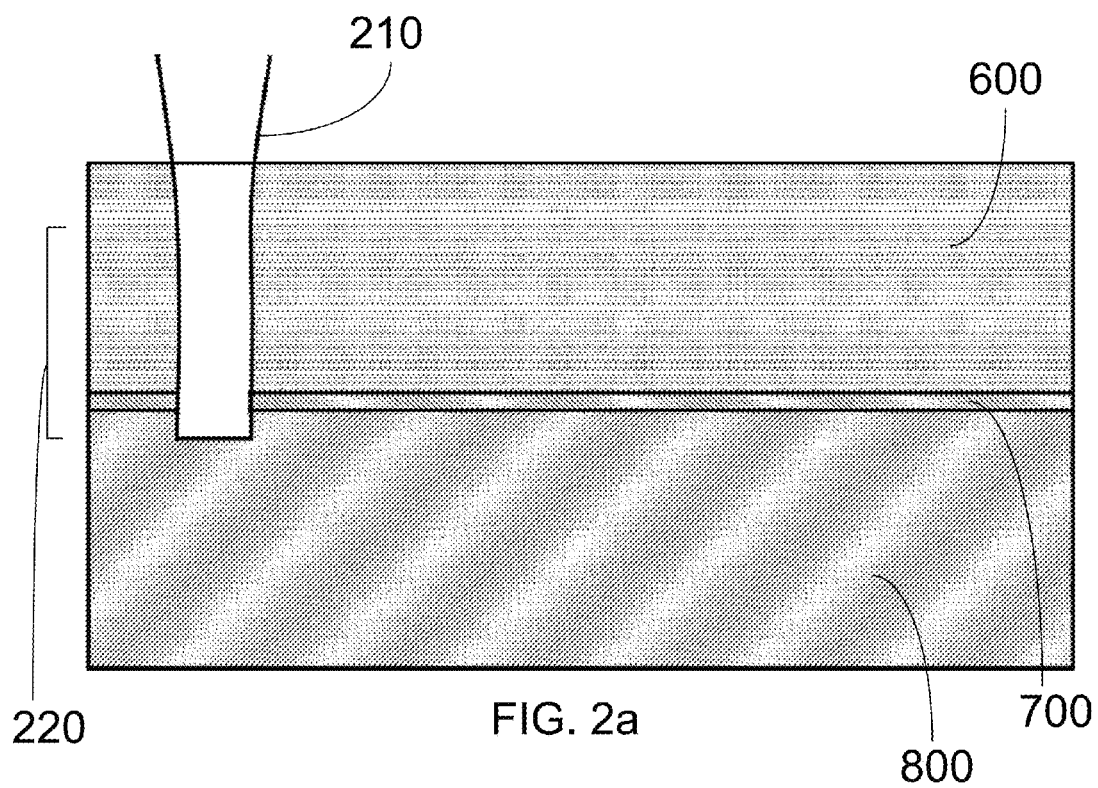

SYSTEM AND METHODS OF EMBEDDING MATERIAL IN A GLASS SUBSTRATE

RELATED APPLICATIONS

The application is related to and claims the benefit under 35 U.S.C. §119(e) of U.S. Provisional Patent Application Ser. No. 61/792,737 titled System and Methods of Embedding Material in a Glass Substrate filed Mar. 15, 2013, the content of which is incorporated herein by reference.

FIELD OF THE INVENTION

The present invention relates to systems and methods for embedding material in a glass substrate.

BACKGROUND

The embedding of materials into a glass substrate is a desired capability in the field of electronics. The ability to embed materials, particularly conducting and semiconducting materials, in glass has a great number of applications. However, current solutions have proven to be unsuccessful in embedding such materials into glass substrates in practice.

U.S. Pat. No. 6,939,748 to Quick titled Nano-Size Semiconductor Component and Method of Making Same discloses a method for making nano-sized semiconductor components within a wide-bandgap semiconductor. The disclosures of this patent are satisfactory for creating a semiconductor component in semiconducting substrate, but the methods disclosed therein do not successfully embed material in a glass substrate.

U.S. Pat. No. 7,419,887 to Quick titled Laser Assisted Nano Deposition discloses an apparatus and method for forming a non structure on a substrate with nano particles. Similar to the '748 patent, the systems and methods disclosed herein are satisfactory for embedding material in a substrate that is a semiconducting material, but cannot be successfully employed to embed material in a glass substrate.

U.S. Pat. No. 7,951,632 to Quick et al titled Optical Device and Method of Making discloses forming an optical device within a wide-bandgap semiconductor substrate. Similar to the '748 and '887 patents, the systems and methods disclosed herein are satisfactory for embedding material in a substrate that is a semiconducting material, but cannot be successfully employed to embed material in a glass substrate.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to a method for embedding a dopant into a glass substrate. The method may comprise the steps of applying the dopant to a surface of the glass substrate, positioning the glass substrate adjacent to a catalyst such that the dopant is intermediate the catalyst and the glass substrate, heating the glass substrate to a first temperature above an ambient environmental temperature, operating a directed thermal energy source so as to generate thermal energy incident upon the dopant, reducing the temperature of the glass substrate to a second temperature above the ambient environmental temperature but below the first temperature, and holding the glass substrate at the second temperature for at least a period of time.

The first temperature may be above a stress-relief point of the glass substrate. Furthermore, the first temperature may be below a softening point of the glass substrate. Additionally, the first temperature may be at least 600° Celsius. Yet further, the first temperature may be 650° Celsius. The second temperature may be at least 560° Celsius. Additionally, the second temperature may be 590° Celsius.

The dopant may comprise at least one of copper, zinc and gold. In some embodiments, the dopant may comprise at least one of polyurethane and borax. The method may further comprise the step of reducing the temperature of the glass substrate to ambient environmental temperature. The step of holding the glass substrate at the second temperate for the period of time may comprise holding the glass substrate at the second temperature for between 5 minutes and 10 minutes.

The thermal energy generated by the directed thermal energy source may have a peak wavelength of at least one of 355 nanometers and 532 nanometers. Furthermore, the step of operating the directed thermal energy source may comprise operating the directed thermal energy source at a pulse frequency of about 8 kHz.

In some embodiments, the step of heating the glass substrate comprises indirectly heating the glass substrate by heating the catalyst. The catalyst may be heated by use of an infrared heating device. The catalyst may comprise at least one of stainless steel, nickel, gold, aluminum, iron, and manganese.

The glass substrate, the dopant, and the catalyst may be positioned in an ambient air environment such that the thermal energy generated by the directed thermal energy source is incident upon the dopant in the ambient air environment. The glass substrate may comprise at least one of borosilicate and soda-lime glass.

Additional embodiments of the invention may be directed to a method for embedding a dopant into a glass substrate comprising the steps of applying the dopant to a surface of the glass substrate, positioning the glass substrate adjacent to a catalyst such that the dopant is intermediate the catalyst and the glass substrate, positioning each of the glass substrate, the dopant, and the catalyst in a sample chamber, depressurizing the sample chamber to a pressure within the range from about 0 kPa to about −100 kPa, and operating a directed thermal energy source so as to generate a beam of thermal energy incident upon the dopant, thereby forming a mixture of the dopant and the catalyst, depositing an embedment of the mixture into the glass substrate, and causing material from the glass substrate to form an isolation layer adjacent the embedment.

The beam may have a peak wavelength of at least one of 355 nanometers and 532 nanometers. Furthermore, the dopant may comprise at least one of copper, aluminum, platinum, gold, and alloys thereof, conductive polymers, Group IV elemental and/or compound semiconductors, Group III-V semiconductors including aluminum-, indium-, and gallium-based semiconductors, and Group II-VI semiconductors including zinc oxide. The catalyst may be a powdered metallic substance.

BRIEF DESCRIPTION OF THE DRAWINGS

FIG. 2a is a schematic representation of an embedding system according to the system depicted in FIG. 1 during an embedding process.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

An embodiment of the invention, as shown and described by the various figures and accompanying text, provides a system for embedding material in a substrate. In some embodiments, the substrate will be a glass substrate. Furthermore, in some embodiments, the material will be embedded in the substrate through the use of a laser.

Figure 1:
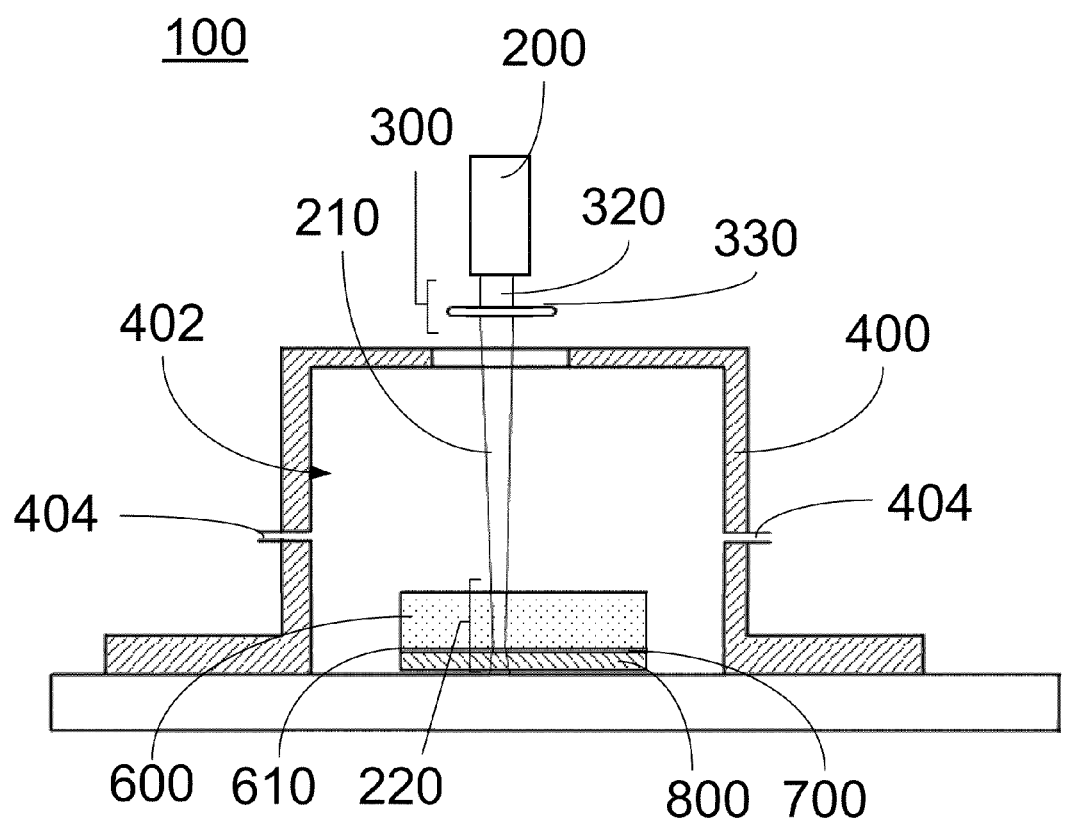
FIG. 1 is a side sectional view of an embedding system according to an embodiment of the present invention.

Referring now to FIG. 1, a system 100 for embedding material in a substrate is presented. The system 100 may include a thermal energy source 200, an optic assembly 300, a sample housing 400, and a base 500. The system 100 may be configured to effectuate an embedding process in a substrate 600. The substrate may have applied to it a dopant 700. Additionally, in some embodiments, a catalyst 800 may be positioned adjacent to the dopant 700 generally opposite the substrate 600.

Continuing to refer to FIG. 1, the sample housing 400 will now be discussed in greater detail. The sample housing 400 may be a structure configured to facilitate a thermal embedding process. Accordingly, the sample housing 400 may be configured to include a number of characteristics in furtherance thereof. The sample housing 400 may be configured to define a sample chamber 402. The sample chamber 402 may be an internal volume of the sample housing 400 having a geometry permitting the positioning therein of the substrate 600, the dopant 700, and the catalyst 800. Furthermore, the sample housing 400 may be configured to permit characteristics of the environment within the sample chamber 402 to be controlled. For example, the sample housing may include one or more ports 404 in fluid communication with the sample chamber 402.

The ports 404 may be configured to permit the gaseous content of the sample chamber 402 to be controlled. In some embodiments, the ports 404 may be configured to attach to and be positioned in fluid communication with a vacuum-generating device. In such embodiments, a user may operate the vacuum-generating device to generally create a vacuum within the sample chamber 402. More specifically, the vacuum generating device may operate to create a negative pressure within the sample chamber 402 within the range from about 0 kilopascals (kPa) to about −60 kPa. In some embodiments, the pressure may be about −30 kPa.

In some embodiments, the ports 404 may be configured to permit the gaseous environment of the sample chamber 402 to be controlled by deliberate introduction of gas into the sample chamber 402. More specifically, the ports 404 may be configured to permit the introduction of gasses, such as, for example, noble gasses into the sample chamber 402. Additionally, the concentration and pressure exerted by the introduced gasses may be controlled via the ports 404. It is contemplated and included within the scope of the invention that any types of gasses, as well as any fluid, into the sample chamber 402 may be controlled via the ports 404. Additionally, the temperature of any gas introduced into the sample chamber 402 may similarly be controlled to facilitate or otherwise control the embedding process.

The sample housing 400 may further include a window 406. The window 406 may be configured to permit the traversal therethrough of electromagnetic energy, such as, for example, a beam of energy generated by the thermal energy source 200. Accordingly, the window 406 may be formed of a material that is generally transparent to electromagnetic radiation within certain ranges of the electromagnetic spectrum including, but not limited to, the visible spectrum, the infrared spectrum, the microwave spectrum, the radio spectrum, the ultraviolet spectrum, the x-ray spectrum, and the gamma ray spectrum. In the present embodiment, the window 406 may be configured to be transparent to the visible spectrum.

Additionally, the window 406 may be configured to be detachable from the sample housing 400, permitting the disposal of objects within the sample chamber 402. The window 406 may be configured to at least partially detach from the sample housing 400 by any suitable means known in the art. In some embodiments, where the window 406 is detachable, the window 406 may further be configured to re-attach to the sample housing 400 such that a fluid-tight seal is formed therebetween. In some further embodiments, the seal formed between the window 406 and the sample housing 400 may be sufficient to permit the creation of a vacuum within the sample chamber 402 as described hereinabove.

Continuing to refer to FIG. 1, the thermal energy source 200 will now be discussed in greater detail. The thermal energy source 200 may be any device capable of generating a beam 210 of thermal energy that may be directed through the use of optics, specifically the optic assembly 300. Generally, the beam 210 will take the form of energy within the electromagnetic spectrum, specifically the visible spectrum, generally defined as within the range from about 390 nm to about 700 nm. However, in some embodiments, the beam may wave a wavelength outside the visible spectrum, such as, for example, within the ultraviolet spectrum, generally defined as within the range from about 10 nm to about 390 nm. The method by which the beam 210 is generated may be any that generates a beam 210 with suitable characteristics to accomplish the embedding process. In some embodiments, the thermal energy source 200 may be a laser. Any type of laser may be selected, including, but not limited to, gas lasers, chemical lasers, dye lasers, metal-vapor lasers, solid state lasers, and laser diodes. The type of laser selected for the thermal energy source 200 may be determined based upon a number of factors, including the material that forms each of the substrate 600, the dopant 700, and the catalyst 800. The types of characteristics of the beam 210 generated by the thermal energy source 200 may include, but are not limited to, the spectral power distribution, more particularly the particular wavelength of light generated, intensity, beam width, focus width, polarization, coherence, and modes of operation, including pulsed and pumped pulsed operation. Furthermore, the thermal energy source 200 may include any control devices, such as a computerized device, necessary to control the parameters of operation of the thermal energy source 200.

Continuing to refer to FIG. 1, the optic assembly 300 will now be discussed in greater detail. The optic assembly 300 may be configured to refract the beam 210 to converge around a desired distance. More specifically, the optic assembly 300 may be configured to include a lens 310 to focus the beam 210 such that a waist 220 of the beam 210 is positioned at a desired distance. For example, the lens 310 may be configured such that the beam waist 220 is incident upon at least one of the substrate 600, the dopant 700, and the catalyst 800. In some embodiments, the beam waist 220 may encompass two or more of the substrate 600, the dopant 700, and the catalyst 800.

Additionally, in some embodiments, the optic assembly 300 may further include a reflection assembly 320. The reflection assembly 320 may be configured to redirect the beam 210 as it is emitted from the thermal energy source 200 so as to be incident upon the lens 310. Furthermore, in some embodiments, the reflection assembly 320 may be configured to actively redirect the beam 210 so as to embed material in various sections of the substrate 600. In such embodiments, the reflection assembly 320 may be attached to and have its movements controlled by a mechanized device, such as a computerized numerical control device. Such an implementation is known in the art.

Referring now to FIG. 1, the base 500 will now be discussed in greater detail. The base 500 may be configured to support the sample housing 400. Moreover, the base 500 may be configured to be movable. In some embodiments, where it is desired for material to be embedded into more than one section of the substrate 600. For example, in some embodiments, the base 500 may be attached to and controller by a mechanized device for moving device. Such a device may be, for example, a computerized numerical control device. It is appreciated that the base 500 may be controlled by any device capable of providing the suitable movements. In some embodiments, the base 500 may be moved along X- and Y-axes. Movement along each of the X- and Y-axes may be desirable to embed material in the substrate 600 in a particular shape, configuration, or pattern. In some further embodiments, the base 500 may be moved along a Z-axis. Movement along the Z-axis may be desirable to coordinate the positioning of each of the substrate 600, the dopant 700, and the catalyst 800 with respect to the beam waist 220.

Continuing to refer to FIG. 1, the substrate 600 will now be discussed in greater detail. The substrate 600 may be a generally transparent material that permits the embedding therein of at least one of the dopant 700 and the catalyst 800. In some embodiments, the substrate 600 may be a glass, a glass-type material, or an otherwise transparent material, including crystalline structures. For example, but not by limitation, the substrate may be formed of soda-lime glass, sapphire, borosilicate, fluoride glasses, aluminosilicates, phosphate glasses, chalcogenide glasses, glass-ceramics, and indium tin oxide.

Additionally, in some embodiments, the substrate 600 may be formed of a material that, when the beam 210 is incident thereupon, fractures predictably. The fracturing of the substrate 600 may be controlled by controlling the heating of the substrate 600 by the beam 210 as well as by controlling the cooling of the substrate 600 once heated by the beam 210. Moreover, where the substrate 600 fractures, it may affect or impart an electrical property of the fractured region of the substrate 600. For example, a fracture may alter the dielectric constant of the material forming the substrate 600, may alter the electrical resistance of the section of the fractured substrate 600, and may alter any other electrical property. Accordingly, various elements of an electrical circuit may be formed by the fracturing of the substrate 600.

Moreover, in some embodiments, the substrate 600 may be heated prior to positioning within the sample chamber 402. Pre-heating of the substrate 600 may be employed to reduce the energy required to perform the embedding process, potentially increasing the rapidity of embedding as well as potentially reducing the power requirement of the thermal energy source 200. Additionally, pre-heating of the substrate 600 may increase the depth into the substrate 600 material may be embedded. Furthermore, in some embodiments, where at least one of the dopant 700 and the catalyst 800 are in thermal communication with the substrate 600, they may similarly be pre-heated.

Continuing to refer to FIG. 1, the dopant 700 will now be discussed in greater detail. The dopant 700 may be any material that is desirously embedded within the substrate 600. Accordingly, the dopant 700 may be any material that, when the beam 210 is incident upon at least one of the dopant 700 and the catalyst 800, is embedded into the substrate 600. More specifically, the dopant 700 may be embedded into the region of the substrate 600 generally adjacent to the dopant 700. Furthermore, the dopant 700 may be a material that is selected for its electrical properties. Yet further, the dopant 700 may be a material that is selected for its electrical properties once embedded in the substrate 600. Yet further, the dopant 700 may be a material that is selected for its electrical properties when embedded in the substrate 600 as a mixture with the catalyst 800. Types of materials the dopant 700 may be formed of includes, but is not limited to, electrically conductive materials, including metals such as copper, aluminum, platinum, gold, zinc, and alloys thereof, conductive polymers, and semiconducting materials, including Group IV elemental and/or compound semiconductors, Group III-V semiconductors including aluminum-, indium-, and gallium-based semiconductors, and Group II-VI semiconductors including zinc oxide. Moreover, the type of dopant 700 selected may depend on the characteristics of the beam 210, including wavelength, phase, and intensity.

The dopant 700 may be embedded into the substrate 600 so as to form part of a circuit that is also embedded in the substrate 600. Accordingly, the selection of the material to form the dopant 700 may be made based on the role of the dopant 700 in the eventual circuit. For example, where the dopant 700 is to form conductive traces between constituent electrical components of the circuit, the dopant 700 may be a conductive material, as described hereinabove. Furthermore, where the dopant is to form an electronic component, a variety of materials may be selected. For example, where the dopant 700 is to form a capacitor, a conductive material may be selected, and a gap in the embedding of the dopant 700 may be left, such that the substrate between adjacent embedments of the dopant 700 may act as a dielectric. As another example, where the dopant 700 is to form a semiconducting device, such as a diode, a semiconducting material may be selected.

Figure 4:
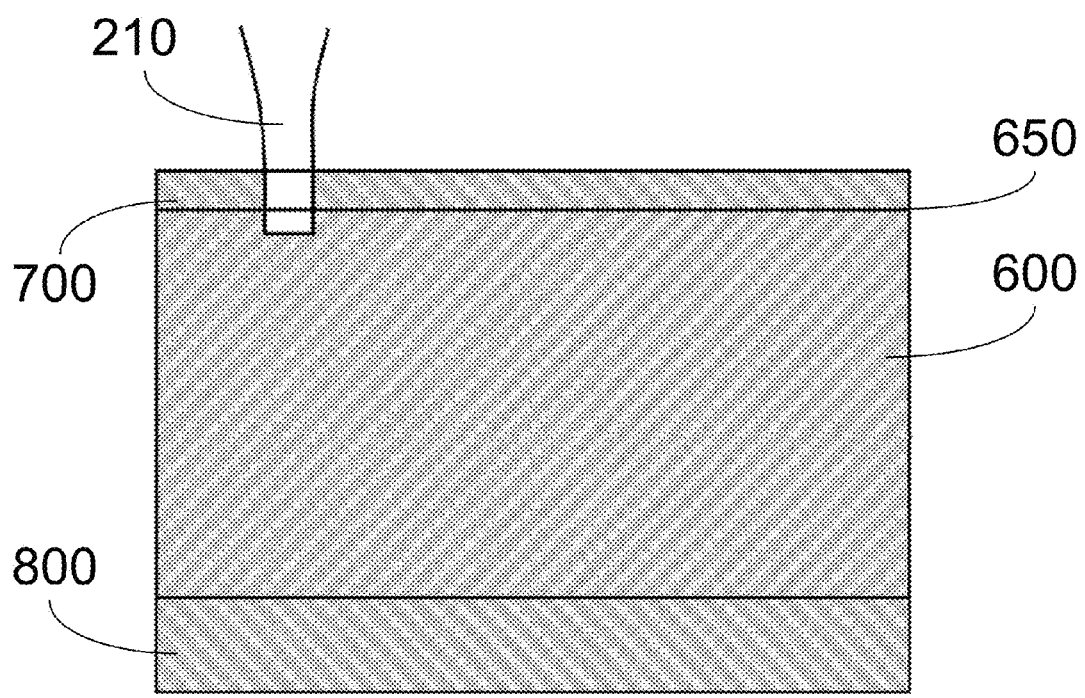
FIG. 4 is a schematic representation of an embedding system according to another embodiment of the present invention.

The dopant 700 may be applied to a surface of the substrate 600. Furthermore, in some embodiments, the dopant 700 may be applied to a surface of the substrate to have a uniform thickness. For example, the dopant 700 may be applied to a lower surface 610 of the substrate 600. It is appreciated and included within the scope of the invention that the dopant 700 may be applied to any surface of the substrate 600, including an upper surface 650 (as shown in FIG. 4). As another example, the dopant 700 may be applied to the lower surface 610 to have a uniform thickness within the range from about 5 nm to about 20 nm. As a further example, the dopant 700 may be applied to the lower surface 610 to have a uniform thickness of about 10 nm. The dopant 700 may be applied to the substrate 600 by any suitable method known in the art, including, but not limited to, vapor deposition, such as sputter deposition, film attachment, and printing. These methods are exemplary only and do not limit the methods of applying the dopant 700 to the substrate 600.

Continuing to refer to FIG. 1, the catalyst 800 will now be discussed in greater detail. The catalyst 800 may be configured to facilitate the embedding of the dopant 700 into the substrate 600. Furthermore, in some embodiments, the catalyst 800 may be configured to facilitate the embedding of the dopant 700 into the substrate 600 by forming a mixture when the beam 210 is incident thereupon. In such embodiments, the catalyst 800 may be embedded in the substrate 600 as a mixture with the dopant 700. In other embodiments, the catalyst 800 may not form a mixture with the dopant 700 such that the embedment is substantially free of the material forming the catalyst 800.

The catalyst 800, in those embodiments where it is configured to form a mixture with the dopant 700, may be a material that is, first, selected based on having a melting point within the range of temperature that will be experienced when the beam 210 is incident thereupon, and second, having electrical properties when mixed with the dopant 700 and embedded in the substrate 600. For example, and not by means of limitation, the catalyst 800 may be a powdered metallic substance, such as nickel, gold, aluminum, iron, manganese.

Additionally, in some embodiments, the catalyst 800 may be an integral piece of metal or metal alloy, such as stainless steel. In such embodiments, the catalyst 800 may or may not be configured to form a mixture with the dopant 700. Furthermore, the dopant may comprise a mixture of at least one of any of the aforementioned materials and at least one of polyurethane and borax.

Additionally, in some embodiments, the catalyst 800 may be configured to facilitate the embedding of the dopant 700 into the substrate 600 without forming a mixture therewith. In such embodiments, the catalyst 800 may be selected based on having a melting point above the temperature that will be experienced when the beam 210 is incident thereupon or, alternatively, not forming a mixture with the dopant 700 when melted. Moreover, each of the catalyst 800 and the dopant 700 may be selected based on the melting point of the substrate 600. For example, each of the catalyst 800 and the dopant 700 may have a melting point that is above, below, or approximately equal to the melting point of the substrate 600. Therefore, in such embodiments, the catalyst 800 may be formed of a ceramic material, such as silicon nitride, and/or diamond. It is contemplated that other types of material having the aforementioned properties may be used as the catalyst 800 in such embodiments.

Figure 2B:
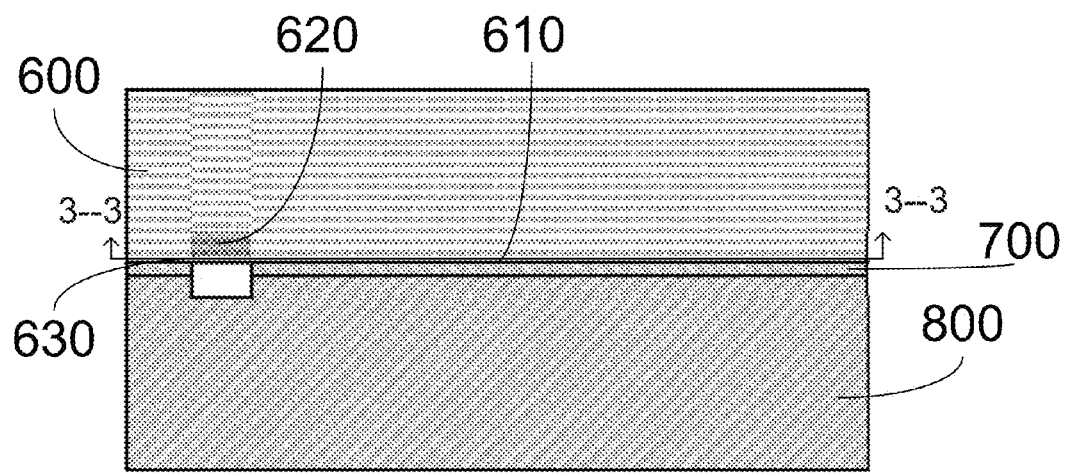
FIG. 2b is a schematic representation of the embedding system of FIG. 2a after completion of the embedding process.
Figure 2C:
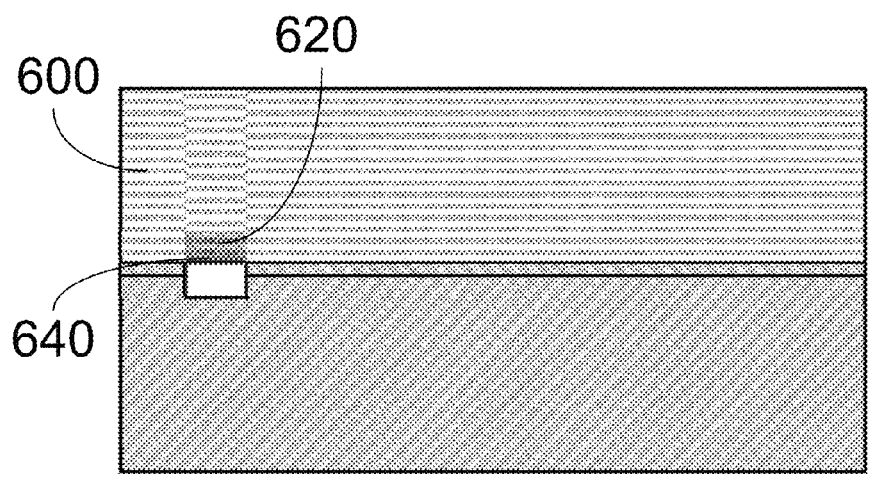
FIG. 2c is an alternative schematic representation of the embedding system of FIG. 2a after completion of the embedding process.

Referring now to FIGS. 2a-c the process of embedding the material into the substrate 600 will now be discussed. Turning to FIG. 2a, as presented in FIG. 1 and described in the accompanying text, the beam 210 may be directed to as to be incident upon at least one of the dopant 700 and the catalyst 800. More specifically, the beam 210 may be directed and focused such that the beam waist 220 is incident upon at least one of the dopant 700 and the catalyst 800. In some embodiments, the dopant 700 may be of sufficiently small thickness that the beam 210 may penetrate therethrough and be incident upon the catalyst 800.

Referring now to FIG. 2b, where the beam 210 is incident upon at least one of the dopant 700 and the catalyst 800, the beam 210 may cause a reaction that causes at least one of the dopant 700 and the catalyst 800 to be deposited as an embedment 620 in the substrate 600. As described hereinabove, the embedment 620 may be composed solely of the dopant 700, or may be composed of a mixture of the dopant 700 and the catalyst 800. The embedment 620 may be embedded within the substrate 600 such that a gap 630 is present, offsetting the embedment 620 from the lower surface 610 of the substrate 600. The gap 630 may advantageously prevent the properties of the embedment 620, such as the electrical properties, from being manifested on the lower surface 610. As such, the embedment 620 may be electrically isolated from the lower surface 610 as well as the environment surrounding the lower surface 610, as well as the substrate generally 600.

Turning now to FIG. 2c, an alternative embodiment is presented, wherein material from the substrate 600 flows into the gap 630 as shown in FIG. 2b to form an isolation layer 640. The isolation layer 640 may further isolate the embedment 620 as described hereinabove.

Figure 3:
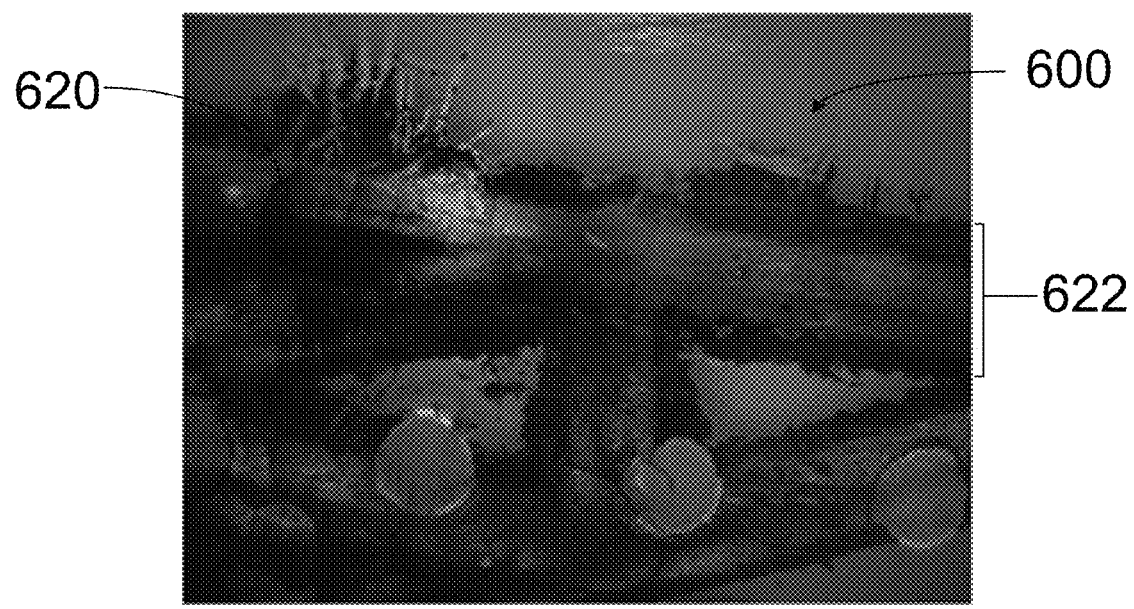
FIG. 3 is a micrograph taken along line 3-3 in FIG. 2b of the embedment embedded in the glass substrate.

Referring now to FIG. 3, an image of the embedment 620 embedded in the substrate 600 is presented. The embedment 620 may have a width 622 that is approximately equal to the width of the beam 210 as shown in FIG. 1. In some embodiments, the width 622 may be within the range from about 200 μm to about 400 μm.

EXAMPLE I

In a first example, the system 100 as depicted in FIG. 1 may include a thermal energy source 200 being a laser configured to emit a green light. More specifically, the thermal energy source 200 may emit light having a wavelength of 532 nm. Additionally, the thermal energy source 200 may be configured to operate with specific parameters. In the present example, the thermal energy source 200 may be configured to operate with a pulse frequency of approximately 8 kHz and a pulse length of approximately 8 μs. Moreover, the thermal energy source 200 may be configured to deliver approximately 67.9 watts of power having a pulse energy of approximately 11.32 millijoules, an irradiance of approximately 3.46 W/mm², and/or a fluence of approximately 576.64 J/mm². The substrate 600 may be formed of soda-lime glass, and the dopant 700 may be formed of gold having a uniform thickness of approximately 10 nm. Additionally, the catalyst 800 may be a nickel powder. The sample chamber 402 may be depressurized to a vacuum having a negative pressure of approximately −100 kPa. The result of the embedding process of this example is depicted in FIG. 3.

EXAMPLE II

An alternative embodiment of the invention is depicted in FIG. 4. In the depicted embodiment, the system may include substantially all the elements of the system 100 depicted in FIG. 2A, however the position of the dopant 700 may be altered. The dopant 700 may be applied to an upper surface 650 of the substrate 600 as described hereinabove. In the present embodiment, the dopant 700 may be formed of a material substantially as described hereinabove. However, in the present embodiment, the dopant 700 is preferably formed to a uniform thickness that is sufficient for enough of the thermal energy delivered by the beam 210 is absorbed by the dopant 700 so as to embed the dopant 700 into the substrate 600. In the present example, the thermal energy source 200 may be a blue/ultraviolet laser. More specifically, the thermal energy source 200 may be a laser configured to emit light having a wavelength of 355 nm.

EXAMPLE III

Figure 5:
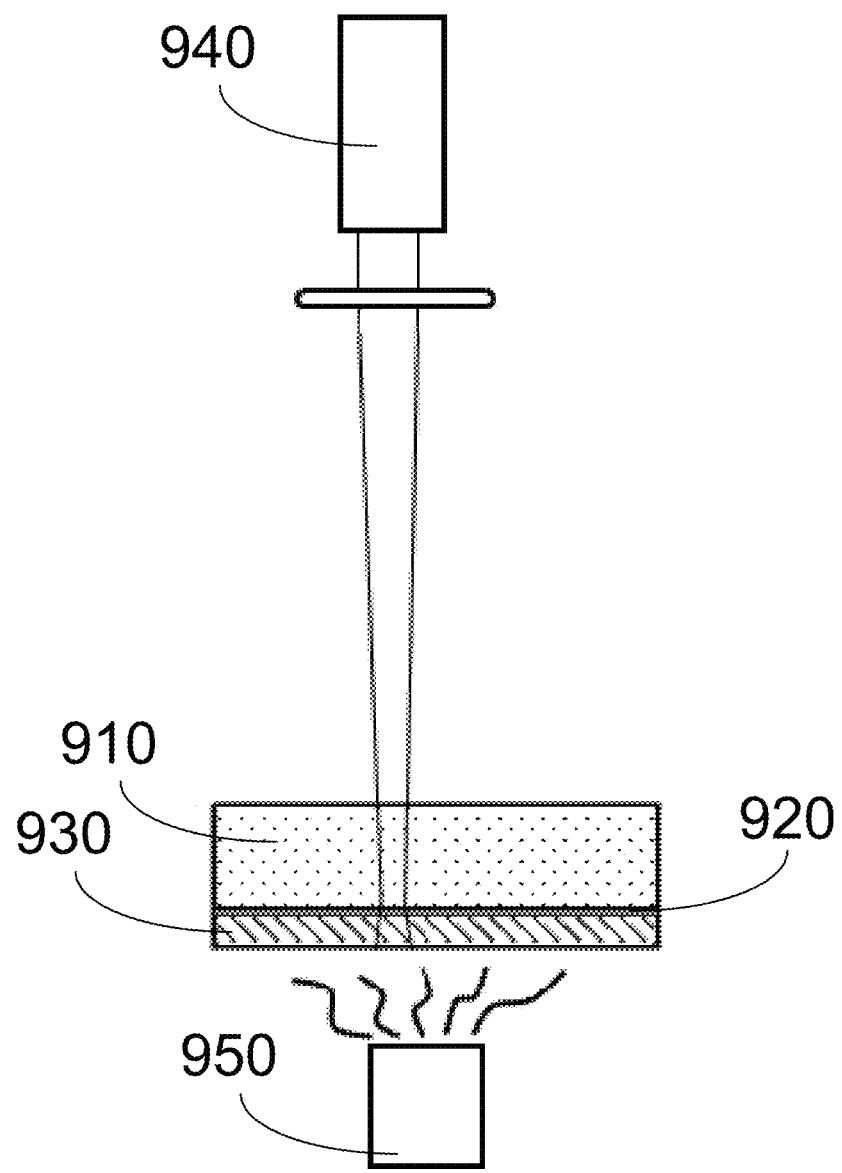
FIG. 5 is a schematic view of an embedding system according to an embodiment of the invention.

Referring now to FIG. 5, another embodiment of the present invention will now be discussed. Several aspects of the present embodiment may be identical, or at least similar to, aspects of the embodiment represented in FIGS. 1-4 and the corresponding disclosure hereinabove. More specifically, a glass substrate 910 may have a dopant 920 applied to a surface thereof by any means or method as described hereinabove. The glass substrate 910 may be positioned adjacent to a catalyst 930, the catalyst 930 being as described hereinabove, such that the dopant 920 is intermediate the glass substrate 910 and the catalyst 930. The system may further comprise a thermal energy source 940 configured to generate and emit thermal energy in a direction, such that a beam of thermal energy may be directed toward at least one of the glass substrate 910, the dopant 920, and the catalyst 930.

In the present embodiment, each of the glass substrate 910, the dopant 920, and the catalyst 930 may be positioned in an ambient environment. More specifically, they may be positioned so as to be exposed to the surrounding environment, in contrast to the use of the sample housing 400 employed in other embodiments. Moreover, the glass substrate 910, the dopant 920, and the catalyst 930 may be positioned in the ambient air environment such that thermal energy generated by the directed thermal energy source 940 is incident upon at least one of the glass substrate 910, the dopant 920, and the catalyst 930 in the ambient air environment.

In some embodiments, the system may further include a heating element 950. The heating element 940 may be configured to heat the glass substrate 910, either directly or indirectly. For example, in the present embodiment, the heating element 950 may be configured to heat the catalyst 930 which may cause the glass substrate 910 to be heated thereby. The heating element 950 may be any device as is known in the art that is capable of heating at least one of the glass substrate 910, the dopant 920, or the catalyst 930 directly. In the present embodiment, the catalyst 930 may be stainless steel, and the heating element 950 may be an infrared heating device.

The heating element 950 may be used to heat the glass substrate 910 above an ambient environmental temperature prior to thermal energy from the directed thermal energy source 940 being incident upon any of glass substrate 910, the dopant 920, and the catalyst 930. For example, the heating element 950 may cause the glass substrate 910 to be heated to a first temperature that is above a stress-relief point of the glass substrate 910. Such a first temperature may be at least 600° Celsius. In some embodiments, the glass substrate 910 may be heated to a first temperature of 650° Celsius. In some embodiments, the glass substrate 910 may be heated to a first temperature below a softening point of the glass substrate 910. Once the glass substrate 910 has been heated to the first temperature, the directed thermal energy source 940 may be operated so as to generate thermal energy upon the dopant 620. The operation of the directed thermal energy source 940 may cause the dopant 920 to become embedded in the glass substrate 910 substantially as described hereinabove. In the present embodiment, the thermal energy generated by the directed thermal energy source may pass through the glass substrate 910 prior to being incident upon the dopant 920. The temperatures provided hereinabove are exemplary only and any temperature is contemplated and included within the scope of the invention.

After operating the directed thermal energy source 940, the heating element 950 may be operated so as to reduce the temperature of the glass substrate 910 from the first temperature to a second temperature. The second temperature may be below the first temperature but above the ambient environmental temperature. In some embodiments, the second temperature may be at least 560° Celsius. In some embodiments, the second temperature may be 590° Celsius. The temperatures provided hereinabove are exemplary only and any temperature is contemplated and included within the scope of the invention.

After reducing the temperature of the glass substrate 910 to the second temperature, the heating element 950 may be operated so as to hold the glass substrate 910 at the second temperature for a period of time. The period of time may be any period of time that is sufficient to reduce the formation of cracks in the glass substrate. In some embodiments, the period of time may be at least one minute. In some embodiments, the period of time may be for between 5 minutes and ten minutes. Any period of time is contemplated and included within the scope of the invention. After holding the glass substrate 910 at the second temperature for a period of time, operation of the heating element 950 may discontinue, and the temperature of the glass substrate 910 may be allowed to return to the ambient environmental temperature.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

What is claimed is:

1. A method for embedding a dopant into a glass substrate comprising the steps of:
    applying the dopant to a surface of the glass substrate;
    positioning the glass substrate adjacent to a catalyst such that the dopant is intermediate the catalyst and the glass substrate;
    heating the glass substrate to a first temperature above an ambient environmental temperature;
    operating a directed thermal energy source so as to generate thermal energy incident upon the dopant;
    reducing the temperature of the glass substrate to a second temperature above the ambient environmental temperature but below the first temperature; and
    holding the glass substrate at the second temperature for at least a period of time.

2. The method according to claim 1 wherein the first temperature is above a stress-relief point of the glass substrate.

3. The method according to claim 1 wherein the first temperature is below a softening point of the glass substrate.

4. The method according to claim 1 wherein the first temperature is at least 600° Celsius.

5. The method according to claim 4 wherein the first temperature is 650° Celsius.

6. The method according to claim 1 wherein the second temperature is at least 560° Celsius.

7. The method according to claim 6 wherein the second temperature is 590° Celsius.

8. The method according to claim 1 wherein the dopant comprises at least one of copper, zinc and gold.

9. The method according to claim 1 wherein the dopant comprises at least one of polyurethane and borax.

10. The method according to claim 1 further comprising the step of reducing the temperature of the glass substrate to ambient environmental temperature.

11. The method according to claim 1 wherein the step of holding the glass substrate at the second temperate for the period of time comprises holding the glass substrate at the second temperature for between 5 minutes and 10 minutes.

12. The method according to claim 1 wherein the thermal energy generated by the directed thermal energy source has a peak wavelength of at least one of 355 nanometers and 532 nanometers.

13. The method according to claim 1 wherein the step of operating the directed thermal energy source comprises operating the directed thermal energy source at a pulse frequency of about 8 kHz.

14. The method according to claim 1 wherein the step of heating the glass substrate comprises indirectly heating the glass substrate by heating the catalyst.

15. The method according to claim 14 wherein the catalyst is heated by use of an infrared heating device.

16. The method according to claim 1 wherein the catalyst comprises at least one of stainless steel, nickel, gold, aluminum, iron, and manganese.

17. The method according to claim 1 further comprising the step of positioning each of the glass substrate, the dopant, and the catalyst in an ambient air environment such that the thermal energy generated by the directed thermal energy source is incident upon the dopant in the ambient air environment.

18. The method according to claim 1 wherein the glass substrate comprises at least one of borosilicate and soda-lime glass.

19. A method for embedding a dopant into a glass substrate comprising the steps of:
    applying the dopant to a surface of the glass substrate;
    positioning the glass substrate adjacent to a catalyst such that the dopant is intermediate the catalyst and the glass substrate;
    positioning each of the glass substrate, the dopant, and the catalyst in an ambient air environment;
    heating the glass substrate to 650° Celsius;
    operating a directed thermal energy source so as to generate a beam of thermal energy incident upon the dopant;
    reducing the temperature of the glass substrate to 590° Celsius;
    holding the glass substrate at the second temperature for between 5 minutes and 10 minutes; and
    reducing the temperature of the glass substrate to ambient environmental temperature.

20. The method according to claim 19 wherein the steps of heating the glass substrate comprises indirectly heating the glass substrate by heating the catalyst by use of an infrared heating device.

21. A method for embedding a dopant into a glass substrate comprising the steps of:
    applying the dopant to a surface of the glass substrate;
    positioning the glass substrate adjacent to a catalyst such that the dopant is intermediate the catalyst and the glass substrate;
    positioning each of the glass substrate, the dopant, and the catalyst in a sample chamber;
    depressurizing the sample chamber to a pressure within the range from about 0 kPa to about −100 kPa; and
    operating a directed thermal energy source so as to generate a beam of thermal energy incident upon the dopant, thereby forming a mixture of the dopant and the catalyst, depositing an embedment of the mixture into the glass substrate, and causing material from the glass substrate to form an isolation layer adjacent the embedment;
    wherein the beam has a peak wavelength of at least one of 355 nanometers and 532 nanometers; and
    wherein the dopant comprises at least one of copper, aluminum, platinum, gold, and alloys thereof, conductive polymers, Group IV elemental and/or compound semiconductors, Group III-V semiconductors including aluminum-, indium-, and gallium-based semiconductors, and Group II-VI semiconductors including zinc oxide; and
    wherein the catalyst is a powdered metallic substance.

* * * * *